United States Patent
Sikka

(10) Patent No.: US 10,162,915 B2
(45) Date of Patent: Dec. 25, 2018

(54) METHOD AND SYSTEM FOR EMULATION OF MULTIPLE ELECTRONIC DESIGNS IN A SINGLE TESTBENCH ENVIRONMENT

(71) Applicant: Prateek Sikka, New Delhi (IN)

(72) Inventor: Prateek Sikka, New Delhi (IN)

(*) Notice: Subject to any disclaimer, the term of this patent is extended or adjusted under 35 U.S.C. 154(b) by 20 days.

(21) Appl. No.: 15/456,069

(22) Filed: Mar. 10, 2017

(65) Prior Publication Data

US 2017/0270228 A1   Sep. 21, 2017

(30) Foreign Application Priority Data

Mar. 21, 2016  (IN) .............................. 201611009846

(51) Int. Cl.
*G06F 17/50*  (2006.01)

(52) U.S. Cl.
CPC ................................ *G06F 17/5027* (2013.01)

(58) Field of Classification Search
CPC .................................................. G06F 17/5027
USPC ........................................................ 716/106
See application file for complete search history.

(56) References Cited

U.S. PATENT DOCUMENTS

| | | | |
|---|---|---|---|
| 7,237,208 B1* | 6/2007 | Ip .......................... | G06F 17/504 716/106 |
| 7,813,912 B1* | 10/2010 | Sundararajan ...... | G06F 17/5022 703/22 |
| 2009/0150136 A1* | 6/2009 | Yang ................... | G06F 17/5022 703/13 |
| 2011/0184713 A1* | 7/2011 | Yang ................... | G06F 17/5022 703/13 |
| 2014/0052430 A1* | 2/2014 | Suresh ................ | G06F 17/5045 703/14 |

* cited by examiner

*Primary Examiner* — Suresh Memula
(74) *Attorney, Agent, or Firm* — Justin Lampel

(57) ABSTRACT

According to the present invention, a method and system for emulating multiple electronic designs on a single testbench is disclosed wherein number of instances of the original design to be connected on a single testbench is derived by calculating the capacity of the design and the testbench. It further creates a new wrapper design corresponding to number of instances of the original design; and selectively adapt the design for emulation.

14 Claims, 2 Drawing Sheets

METHOD AND SYSTEM FOR EMULATION OF MULTIPLE ELECTRONIC DESIGNS IN A SINGLE TESTBENCH ENVIRONMENT

TECHNICAL FIELD

The present disclosure relates to the field of integrated circuits and, more particularly, to a system and method which enhances the emulation performance and efficiency by systematically emulating multiple electronic designs in a single testbench environment.

BACKGROUND

Modern electronic system has large numbers of subsystems, with millions of gates in each subsystem. Because of this, a minimal system simulation consisting of just a few of the subsystems results in a bloated and unmanageable emulation environment. For example, modern scalable multiprocessors may have hundreds or thousands of nodes. Each node may include tens of millions of gates. Testing and verifying such a system quickly becomes difficult, impeding the design process.

However, it is crucial to verify the design for proper functionality, prior to physical fabrication on an integrated circuit chip. While being tested, an HDL (hardware description language) model of a design is generated and is called a Design Under Test (DUT). This DUT is simulated using a testbench. The testbench generates a set of input test vectors and applies the vectors to the DUT. Testbench in its traditional form is described at a behavioral level and defines the environment for the DUT in its target system.

Design verification may be performed using a variety of methods. For example, software based simulators are the most commonly used tools. Software simulators have an advantage in that they can accept HDL at any level of abstraction, thus providing a way to simulate both a DUT and its testbench. However, such simulators have a disadvantage in that, for large designs, simulators typically can achieve a speed of not more than a few tens to hundreds of clock cycles per second (cps).

To increase the overall simulation speed, co-simulation approaches have been used, in which the behavioral testbench runs on a software simulator and the DUT is executed onto a reconfigurable hardware platform. The reconfigurable hardware platform may be implemented having a plurality of reconfigurable hardware elements, such as a set of general-purpose processors and/or Field Programmable Gate Arrays (FPGAs).

When a single design is executed on a reconfigurable hardware platform like an FPGA, irrespective of its size, it prevents the usage of same hardware by other designs. It further blocks the precious real-estate of the acceleration hardware platform. Most hardware designs occupy an effective area of the hardware chips equivalent to non-integer number of FPGA boards e.g. a design may occupy 70% silicon area of the actual FPGA hardware and other designs may be small i.e. may not even occupy even a single FPGA chip.

Hence, there is a strong need for a methodology and an associated system which makes efficient usage of area of a reconfigurable hardware platform and make resources available for the execution of multiple DUTs on a single testbench.

SUMMARY

The following presents a simplified summary of the subject matter in order to provide a basic understanding of some aspects of subject matter embodiments. This summary is not an extensive overview of the subject matter. It is not intended to identify key/critical elements of the embodiments or to delineate the scope of the subject matter.

Its sole purpose is to present some concepts of the subject matter in a simplified form as a prelude to the more detailed description that is presented later.

It is therefore a primary objective of this disclosure to provide a method and an associated system that provides efficient usage of area of a reconfigurable hardware platform and make resources available for the execution of multiple DUTs on a single testbench.

It is an object of the invention, to ensure better and more efficient usage of hardware resources.

These and other objects, embodiments and advantages of the present disclosure will become readily apparent to those skilled in the art from the following detailed description of the embodiments having reference to the attached figures, the disclosure not being limited to any particular embodiments disclosed.

BRIEF DESCRIPTION OF THE DRAWINGS

For a better understanding of the embodiments of the systems and methods described herein, and to show more clearly how they may be carried into effect, reference will now be made, by way of example, to the accompanying drawings, wherein.

DETAILED DESCRIPTION

Figure 1:
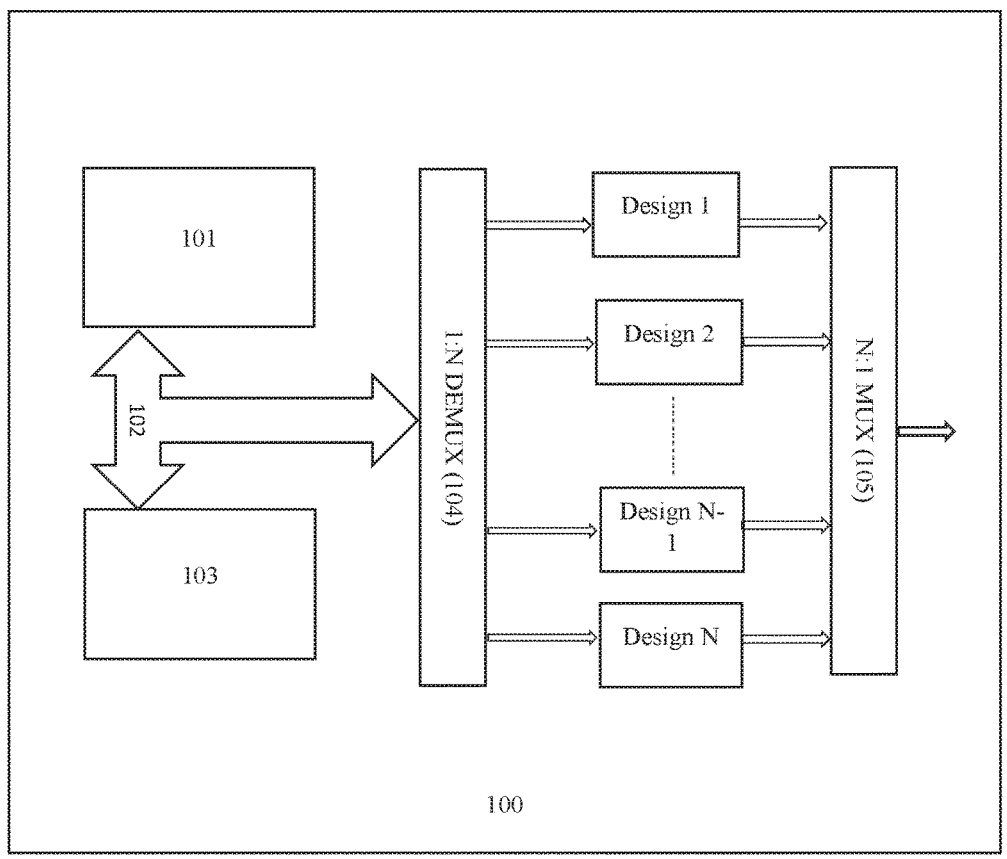
FIG. 1 illustrates an emulation environment of multiple DUTs on a single testbench in accordance with the present invention.

Exemplary embodiments now will be described with reference to the accompanying drawings. The disclosure may, however, be embodied in many different forms and should not be construed as limited to the embodiments set forth herein; rather, these embodiments are provided so that this disclosure will be thorough and complete, and will fully convey its scope to those skilled in the art. The terminology used in the detailed description of the particular exemplary embodiments illustrated in the accompanying drawings is not intended to be limiting. In the drawings, like numbers refer to like elements.

The specification may refer to "an", "one" or "some" embodiment(s) in several locations. This does not necessarily imply that each such reference is to the same embodiment(s), or that the feature only applies to a single embodiment. Single features of different embodiments may also be combined to provide other embodiments.

As used herein, the singular forms "a", "an" and "the" are intended to include the plural forms as well, unless expressly stated otherwise. It will be further understood that the terms "includes", "comprises", "including" and/or "comprising" when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected"

or "coupled" as used herein may include operatively connected or coupled. As used herein, the term "and/or" includes any and all combinations and arrangements of one or more of the associated listed items.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The figures depict a simplified structure only showing some elements and functional entities, all being logical units whose implementation may differ from what is shown. The connections shown are logical connections; the actual physical connections may be different. It is apparent to a person skilled in the art that the structure may also comprise other functions and structures.

Also, all logical units described and depicted in the figures include the software and/or hardware components required for the unit to function. Further, each unit may comprise within itself one or more components which are implicitly understood. These components may be operatively coupled to each other and be configured to communicate with each other to perform the function of the said unit.

The detailed description follows in parts to terms of processes and symbolic representations of operations performed by conventional computers, including computer components. For the purpose of this disclosure, a computer may be any microprocessor or processor (hereinafter referred to as processor) controlled device.

The main aspect of the present invention discloses a system for emulation of multiple electronic designs in a single testbench environment, said system 100 comprising: stimulus generation logics 101 and 103, a bus 102 coupled with said stimulus generation logics 101 and 103, a selection unit 104 connected to the bus 102, another selection unit 105 connected to the output of design(s) allowing selection of a single design output at one time. The capacity of the FPGA (or Emulation system), testbench and the electronic design(s) to be run is used in order to calculate the number of instance(s) of the design or different design (s) to be run in a single testbench environment on FPGA or emulation system. The system 100 of the present invention is a wrapper design which then generates a stimulus using stimulus generation logics 101 and 103 which acts as an input to the selection unit 104 through the bus 102. The selection unit 104 is driven by the instance(s) of the stimulus generation logic(s) to be run in parallel to effectively utilize the area of FPGA or emulation system The output of instance(s) or the design or different design(s) are then connected to another selection unit 105 which selects one output of a design at a time.

Another aspect of the present invention is a method for emulation of multiple electronic designs in a single testbench, said method comprising of using the capacity of FPGA or emulation system, testbench and the electronic design(s) to obtain number of instance(s) of the design or different design (s) to be run in a single testbench environment. Then creating a wrapper design 100 to run multiple instance(s) of a design or different design (s) to optimize area of FPGA or Emulation system and generating a stimulus using stimulus generation logics 101 and 103 which acts as an input to the selection unit 104 through the bus 102, connecting the output of instance(s) or the design or different design(s) to another selection unit 105 and selecting one output of a design at a time.

The selection unit 104 is driven by the instance(s) of the stimulus generation logic(s) to be run in parallel to effectively optimize the area usage. of FPGA or emulation system.

The number of instance(s) of the design or different design (s) to be connected in a single testbench is calculated based on the size of FPGA or emulation system, testbench and design(s) to be run, as follows:

Number of instances=FPGA/Emulation system capacity/size of design−1

This provides the number of instances of same design or different designs (assuming all designs to be of same size) that can be run in parallel to effectively optimize the area of target platform. Some area is reserved for logic of wrapper design 100 such as selection/deselection, bus or stimulus generation logic on the test bench.

For example—The capacity of an FPGA is 16 MG and the design size is 1 MG, therefore, typically 15 (N=16/1−1) such designs (DUTs) may run in parallel in a single testbench and 1 MG capacity is reserved for other (other than design under test) logic of the system 100.

The system and method of present invention is applicable to almost all design logics, however, there may be some exceptions depending upon specific design and testbench requirements.

For the most part, the operations described herein are operations performed by a computer or a machine in conjunction with a human operator or user that interacts with the computer or the machine. The programs, modules, processes, methods, and the like, described herein are but an exemplary implementation and are not related, or limited, to any particular computer, apparatus, or computer language. Rather, various types of general purpose computing machines or devices may be used with programs constructed in accordance with the teachings described herein.

It would be well appreciated by persons skilled in the art that the term "module" and "unit", "reconfigurable hardware platform" and FPGA, "testbench" and "emulation environment" can be interchangeably used in the present disclosure.

FIG. 1 discloses an emulation environment for emulation of multiple DUTs on a single testbench in accordance with the present invention. It further discloses a system for emulation of multiple electronic designs on a single testbench 100, said system comprising an emulation circuitry 101 switchably coupled to a selected cell for applying one or more electronic design under tests; a bus 102 coupled with the emulation circuitry and operative to transmit and receive test emulation data; a test bench generator 103 configured to receive the emulation data and communicate with the emulation circuitry; and a selection unit 104 to selectively adapt ports disclosed by the design for emulation wherein the test bench generator is configured to determine the capacity of the testbench and the design; generate a number of instances of the original design to be connected on the single testbench, based on the capacity of the design and the testbench; and create a new wrapper design corresponding to number of instances of the original design. The wrapper file comprises a digital wrapper file.

Further, two or more designs can be simultaneously emulated with one another in a single emulation environment. In case, multiple DUTs are exercised, apart from the area utilization, the speed and the emulation test time is also improved as multiple tests can now run in parallel.

It also comprises a selection unit which comprises a multiplexer/demultiplexer logic and is adapted to select DUTs in accordance with said wrapper file.

In an exemplary embodiment, the present invention discloses a single testbench which is generally a virtual environment for verifying the correctness of a design. Usefully, the testbench is created using a Hardware Description Language (HDL). Examples of HDLs that can be used for the testbench are VHDL, Verilog or system Verilog, but this embodiment does not restrict the testbench to just these three HDLs. As described hereinafter in further detail, the testbench operates cooperatively with an emulation circuitry to receive the input vectors for respective testcases, verify the application of each input vector to the electronic devices.

According to another embodiment of the present invention, the optimal capacity utilization of the testbench and design is determined by calculating the number of instances M of the original design to be connected on the single testbench. The value of M is derived from the expression (N/D−1), where, N is the capacity of the testbench emulation resource given in terms of gates and D is the value of number of gates in the design to be tested. For example, if there are more than one design and each of the designs D1 and D2 uses x gates for implementation, then there can be y such instances of the design to make full utilization of the area resources and is given by y=N/x. In other words, if design size is 5 million gates and FPGA capacity is 10 MG, the full capacity can be utilized by instantiating 2 instances of the design. The selection for the design under test may happen or may not happen depending on the emulation scenario.

Figure 2:
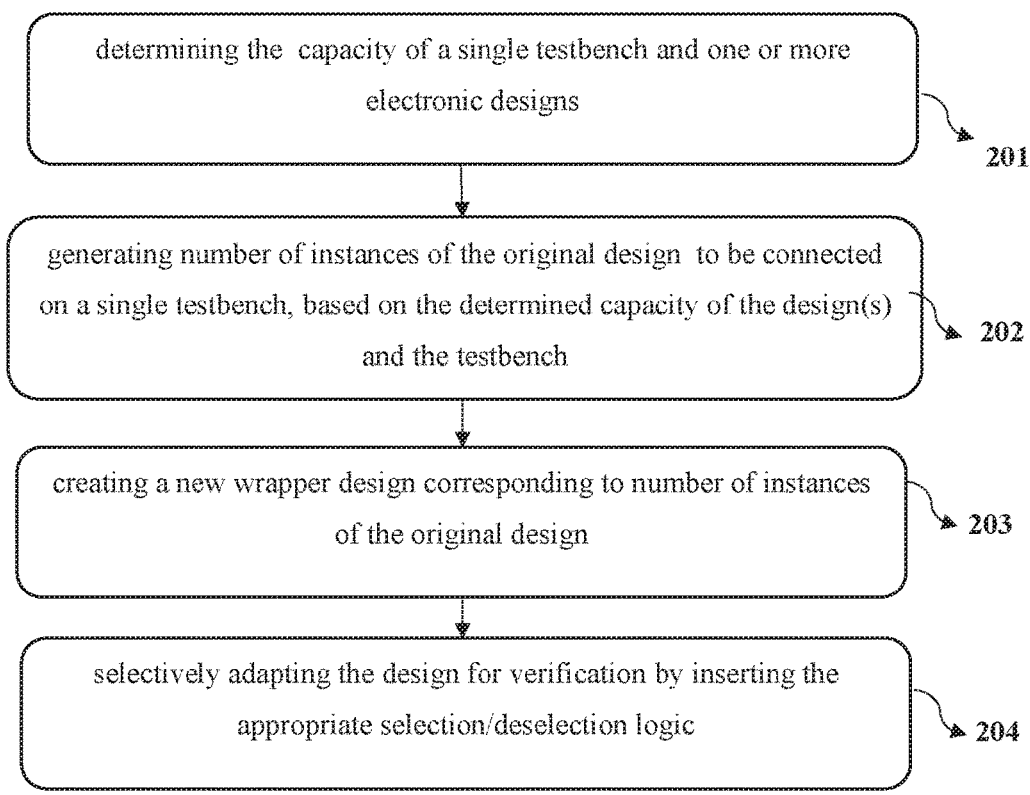
FIG. 2 illustrates a flowchart of a method for emulation of multiple electronic designs on a single testbench in accordance with the invention.

FIG. 2 illustrates a flowchart of a method for emulation of multiple electronic designs on a single testbench in accordance with the invention. In step 201, determining the capacity of a testbench and one or more electronic design. In step 202, generating a number of instances of the original design to be connected on a single testbench, in accordance with the capacity of the design and the testbench. In step 203, creating a new wrapper design corresponding to number of instances of the original design. In step 204, selectively adapting ports disclosed by the design for emulation. It also comprises two or more digital designs which can be simultaneously emulated with one another.

Further, the selection of ports is carried out by means of a multiplexer/demultiplexer logic in accordance with said wrapper file.

In an advantageous embodiment, the disclosed methodology according to the present invention provides a better area utilization of emulation resources of a reconfigurable hardware architecture or a single testbench. Further, the design methodology is technology independent and can act for any kind of testbenches (e.g. FPGA boards) of all capacities.

In another advantageous embodiment, the disclosed system can be easily scaled for any number of DUT instances. Further, in absence of a selection/deselection mechanism between multiple DUTs, the overall emulation time will also be reduced as multiple tests will run in parallel.

The term "bus" and variations thereof, as used herein, can refer to a subsystem that transfers information and/or data between various components. A bus generally refers to the collection communication hardware interface, interconnects, bus architecture, standard, and/or protocol defining the communication scheme for a communication system and/or communication network. A bus may also refer to a part of a communication hardware that interfaces the communication hardware with interconnects that connect to other components of the corresponding communication network. A bus architecture supports a defined format in which information and/or data is arranged when sent and received through a communication network. A protocol may define the format and rules of communication of a bus architecture.

The present disclosure is applicable to all types of on-chip and off chip memories used in various in digital electronic circuitry, or in hardware, firmware, or in computer hardware, firmware, software, or in combination thereof. Apparatus of the invention can be implemented in a computer program product tangibly embodied in a machine-readable storage device for execution by a programmable processor; and methods actions can be performed by a programmable processor executing a program of instructions to perform functions of the invention by operating on input data and generating output. The invention can be implemented advantageously on a programmable system including at least one input device, and at least one output device. Each computer program can be implemented in a high-level procedural or object-oriented programming language or in assembly or machine language, if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data file; such devices include magnetic disks and cards, such as internal hard disks, and removable disks and cards; magneto-optical disks; and optical disks. Storage devices suitable for tangibly embodying computer program instructions and data include all forms of volatile and non-volatile memory, including by way of example semiconductor memory devices, such as EPROM, EEPROM, and flash memory devices; magnetic disks such as internal hard disks and removable disks; magneto-optical disks; and buffer circuits such as latches and/or flip flops. Any of the foregoing can be supplemented by, or incorporated in ASICs (application-specific integrated circuits), FPGAs (field-programmable gate arrays), and/or high performance CPU array based structures.

It will be apparent to those having ordinary skill in this art that various modifications and variations may be made to the embodiments disclosed herein, consistent with the present disclosure, without departing from the spirit and scope of the present disclosure. Other embodiments consistent with the present disclosure will become apparent from consideration of the specification and the practice of the description disclosed herein.

I claim:

1. A system for emulation of multiple electronic designs in a single testbench on FPGA or Emulation system, said system comprising:
   stimulus generation logics;
   a bus coupled with said stimulus generation logics;
   a deselection unit connected to the bus; and
   selection unit;
   wherein, a wrapper design is created to run multiple instance(s) of a design or different design (s) on FPGA or Emulation system to decrease the area, the wrapper design generates a stimulus using the stimulus generation logics which acts as an input to the deselection unit through the bus;
   the deselection unit passes multiple inputs received from the stimulus generation logic(s) in parallel; and
   the output of said instance(s) of design or different design(s) are connected to selection unit which selects one output of a design at a time.

2. The system as claimed in claim 1, wherein number of instances to be run in parallel is equal to the output obtained from FPGA or Emulation capacity divided by size of design minus 1.

3. The system as claimed in claim 1, wherein the system comprises two or more digital designs which can be simultaneously emulated with one another.

4. The system as claimed in claim 1, wherein the capacity of the testbench and digital designs (DUT) is determined in terms of number of gates.

5. The system as claimed in any one of the preceding claims, wherein the deselection/selection units is a multiplexer/demultiplexer logic.

6. The system as claimed in claim 1, wherein said wrapper file comprises a digital design.

7. The system as claimed in claim 1, wherein said testbench is coded using VHDL, Verilog or System Verilog.

8. A method for emulation of multiple electronic designs in a single testbench, said method comprising:
   determining the capacity of FPGA or emulation system, testbench and electronic digital designs(s);
   creating wrapper design to run multiple instance(s) of a design or different design(s) to decrease the area of FPGA or Emulation system;
   generating a stimulus using the stimulus generation logics which is acting as an input to the deselection unit through the bus;
   running multiple instance(s) with stimulus received from the stimulus generation logic(s) in parallel by the deselection unit 104; and
   connecting the output of said instance(s) of design or different design(s) to another selection unit 105 and selecting one output of a design at a time by the said deselection unit.

9. The method as claimed in claim 8, wherein number of instances to be run in parallel is equal to the output obtained from FPGA or Emulation system capacity divided by size of design minus 1.

10. The method as claimed in claim 8, wherein the method comprises two or more digital designs which can be simultaneously emulated with one another.

11. The method as claimed in claim 8, wherein the capacity of the testbench and digital design (DUT) is determined in terms of number of gates.

12. The method as claimed in any one of the preceding claims, wherein the deselection/selection units is a multiplexer/demultiplexer logic.

13. The method as claimed in claim 8, wherein said wrapper design is a digital design.

14. The method as claimed in claim 8, wherein said testbench is coded using VHDL, Verilog or System Verilog.

* * * * *